(12) United States Patent
Mailho et al.

(10) Patent No.: US 6,436,796 B1
(45) Date of Patent: Aug. 20, 2002

(54) SYSTEMS AND METHODS FOR EPITAXIAL PROCESSING OF A SEMICONDUCTOR SUBSTRATE

(75) Inventors: Robert D. Mailho, Sonora; Mark J. O'Hara, San Jose; Glenn A. Pfefferkorn, Fremont; Gary Lee Evans, Pleasanton; Kristian E. Johnsgard, Los Gatos, all of CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/495,402

(22) Filed: Jan. 31, 2000

(51) Int. Cl.[7] .............................................. H01L 21/20
(52) U.S. Cl. ...................................... 438/478; 438/758
(58) Field of Search ................................ 438/495–499, 438/478, 758; 427/457, 461; 118/723 IR, 715, 728; 156/345

(56) References Cited

U.S. PATENT DOCUMENTS

| | | | | |
|---|---|---|---|---|
| 4,579,080 A | * | 4/1986 | Martin et al. ................. | 118/500 |
| 5,683,518 A | * | 11/1997 | Moore et al. ................. | 118/730 |
| 5,743,956 A | * | 4/1998 | Habuka et al. ................ | 117/89 |
| 5,824,158 A | * | 10/1998 | Takeuchi et al. .............. | 118/715 |
| 5,881,208 A | * | 3/1999 | Geyling et al. ............... | 392/418 |
| 5,964,989 A | * | 10/1999 | Nakao ......................... | 204/192.12 |
| 6,001,175 A | | 12/1999 | Maruyama et al. .......... | 117/102 |
| 6,184,489 B1 | * | 2/2001 | Ito et al. ...................... | 156/345 |
| 6,200,433 B1 | * | 3/2001 | Ding et al. ............... | 204/192.15 |
| 6,200,911 B1 | * | 3/2001 | Narwankar et al. ......... | 438/758 |
| 6,217,662 B1 | * | 4/2001 | Kong et al. ................. | 118/725 |
| 2001/0052324 A1 | * | 12/2001 | Rupp et al. ................. | 118/728 |

FOREIGN PATENT DOCUMENTS

GB 2 120 279 A 4/1982 ........... C30B/25/10

OTHER PUBLICATIONS

Patent Abstracts of Japan, vol. 18, No. 458 (E–1596), Aug. 25, 1994 (1994–08–25) & JP 06 151314 A (Kokusai Electric Co. Ltd.), May 31, 1994 (1994–05–31) abstract.

* cited by examiner

*Primary Examiner*—Savitri Mulpuri
(74) *Attorney, Agent, or Firm*—Wilson Sonsini Goodrich & Rosati

(57) ABSTRACT

A thermal processing system and method for processing a semiconductor substrate. An inductor couples energy to a susceptor, wherein the spacing between the inductor and the susceptor is configured for the steady-state portions of a CVD epitaxial deposition process. The temperature uniformity of the susceptor is improved during the transient portions of the process, the heat ramp-up and cool down, by varying the distance of separation between the inductor and the susceptor. Temperature non-uniformities are a common cause of slip. Additional aspects of the invention provide for improved thermal shielding of the edges and top surface of the susceptor. Thicker susceptors also improve temperature uniformity.

30 Claims, 10 Drawing Sheets

SYSTEMS AND METHODS FOR EPITAXIAL PROCESSING OF A SEMICONDUCTOR SUBSTRATE

BACKGROUND OF THE INVENTION

1. Field of the Invention

The field of the present invention relates in general to semiconductor processing. More particularly, the field of the invention relates to systems and methods for chemical vapor deposition (CVD) and thermal processing, such as epitaxial deposition.

2. Background

A variety of semiconductor processes require uniform thermal processing at high temperatures. An example of such a process is called chemical vapor deposition (CVD) in which a layer of a material from the vapor phase is deposited onto a semiconductor substrate having been placed on a susceptor within a reactor. The susceptor is then heated either by induction or high intensity light radiation to high temperatures, typically between about 800 to 1250° C. Gases are then passed through the reactor and the deposition process occurs by chemical reaction, within the gas phase, but closely adjacent to the surface of the substrate. The reaction results in the deposition of the desired product onto the substrate.

One form of this type of processing is called epitaxy, in which a single-crystal layer of a substance is deposited onto a substrate that is also single-crystal in nature. As an example, silicon epitaxy is one of the first steps performed in the fabrication of an integrated circuit device, and in this process a layer of doped single crystal silicon is deposited onto a silicon wafer in order to have a layer of known and closely regulated resistivity into which transistors and other devices may be formed. Epitaxy offers a convenient method for controlling the thickness, concentration, and profile of the doping layer.

An important parameter that must be controlled during an epitaxial deposition is the temperature uniformity of the substrate. Non-uniformities in temperature of the substrate can lead to a process of plastic deformation called slip, in which the crystal relieves built-up stresses by allowing portions of its structure to move relative to other regions. Slip occurs in a crystal over certain crystallographic planes and along certain crystallographic directions, causing one portion of the material to be displaced relative to another. A common cause of slip in a crystal is a temperature gradient during film growth, but it can also be the result of the manner in which the substrate is supported, the mechanism by which the substrate is heated, and the time-temperature profile of the epitaxial process. Slip-related defects are most often found at the edges of a substrate and appear as short lines.

Thermal gradients in a substrate may arise as a result of a non-uniform thermal environment within the CVD reactor. Because there are gases flowing within a CVD reactor, heat transfer mechanisms involve conduction and convection as well as radiation. However, radiative heat transfer may well be the most important with regard to temperature uniformity. A substrate adjacent to a heated susceptor within a cold walled reactor will see a variety of thermal gradients in both axial and radial directions. These thermal gradients have a large effect because radiative heat transfer between two objects is a function of the two temperatures, each temperature taken to the fourth power.

In many CVD and epitaxial deposition systems, high intensity lamps such as tungsten-halogen lamps are used to selectively heat a wafer within a cold wall furnace. Since the lamps have very low thermal mass, the wafer can be heated rapidly. However, it is more difficult to control the temperature of the semiconductor substrate using only low thermal mass lamp heating. Some reactors use a large thermal mass silicon carbide coated graphite susceptor to maintain temperature uniformity of the substrate during processing. The substrate to be processed is placed either on or adjacent to the susceptor, and because of the susceptor's high thermal conductivity, it can conduct heat laterally to maintain temperature uniformity and even out non-uniformities across the substrate. The susceptor is typically wider than the substrate which allows it to compensate for radiative heat loss at the edge of the substrate.

Alternatively, the susceptor may be heated by RF induction. This method takes advantage of the fact that an oscillating electric current passing through a conductor placed adjacent to the susceptor produces an oscillating magnetic field around the conductor, which in turn induces an oscillating current in the susceptor itself. Since the susceptor has an electrical resistance, the oscillating electrical current causes the susceptor to heat up. It should be noted that the current induced in the susceptor falls off non-linearly with distance from the conductor. The relationship is that the magnetic flux varies as the inverse square of the distance.

A typical configuration of the coil profile is shown in FIG. 1. The distance between any one particular coil segment and the susceptor may be adjusted with standoffs (not shown in FIG. 1). The coil in FIG. 1 is profiled to compensate for the radiative heat losses that occur at the edge of the susceptor when the susceptor is at processing temperature, and thus, coil segment 120 is closer to the susceptor than coil segment 122. It should be noted that the coil configuration shown in FIG. 1 is optimal when the reactor is at processing temperature, but may not be not optimal during transient periods when the reactor is being heated or cooled.

What is desired is an improved apparatus and method for CVD and/or epitaxial processing of a semiconductor substrate. Preferably, such a system and method would provide a uniform substrate processing temperature such that temperature gradients in the substrate, and the resulting problems with defects such as crystallographic slip, are reduced or eliminated.

SUMMARY OF THE INVENTION

Aspects of the present invention provide a CVD reactor for epitaxial processing, the reactor configured to reduce thermal gradients in the substrates onto which epitaxial layers are being deposited. Reducing thermal gradients in a wafer diminishes slip. One type of epitaxial reactor comprises an RF induction coil positioned adjacent to a silicon carbide coated graphite susceptor. An alternating current through the coil segments produces an oscillating magnetic field around each segment, which in turn induces a current in the susceptor. Electrical energy associated with the induced current is converted into thermal energy, thereby heating the susceptor. The coil is supported by a number of support studs, and the different segments of the coil may be set at different heights, thus varying the distance separating coil segments from the susceptor. Conventional methods of addressing temperature uniformity in a susceptor comprise adjusting the coil segments such that they are closer to the susceptor at the susceptor's inner and outer edges than at the center in order to compensate for the greater amount of heat loss from the edges. Furthermore, the susceptor has to be rotated during heating and processing to minimize temperature gradients caused by the coil.

A problem with conventional methods of addressing temperature uniformity is that coil/susceptor separation profile is configured to provide optimum temperature uniformity in the susceptor at the processing temperature. This profile is not optimal for the transient portions of the process, for example, the heat ramp-up and cool down, where the closely spaced coil segments at the susceptor's edges cause the edges to overheat during ramping. Since the coil/susceptor separation profile is not easily re-configured, especially during processing, apparatus and methods for improving temperature uniformity in the susceptor during the transient portions of the process are needed, assuming the coil/susceptor separation profile is fixed.

An aspect of the present invention provides a mechanism for raising and lowering the susceptor while it is rotating within the reactor. Because the magnetic fields fall off non-linearly with distance from each coil segment, raising the susceptor de-couples the coils at the edge (which are closer to the susceptor) to a greater degree than the coils at the center (which are further away from the susceptor). As a consequence, the over-heating of the susceptor edge that would have occurred during ramp-up may be mitigated. Without this z-motion of the susceptor, the edge of the susceptor may be heated to a temperature as much as 40° C. higher than the center. In one embodiment of the present invention, an algorithm is used to determine the desired distance between the coil and the susceptor to maintain uniformity at different temperatures. The susceptor is moved closer to the coil with each increment in temperature during the transient ramp-up period according to the algorithm. In addition, the susceptor may be moved away from the coil during a transient cool-down period in some embodiments. An additional advantage provided by the z-motion of the susceptor is that the reactor is more convenient to service, since it is easier for maintenance personnel to remove the susceptor from the reactor by first raising it.

Another aspect of the present invention provides for insulator shields that may be placed on top of the susceptor to compensate for those regions of the susceptor not thermally insulated by substrates. Heat loss from the susceptor occurs predominantly by radiation, and is proportional to the difference between $(T_{susceptor})^4$ and $(T_{environment})^4$. The substrates themselves tend to provide insulation at the susceptor pockets which support the substrates, and shielding the remaining regions improves the temperature uniformity of the susceptor.

Another aspect of the present invention provides for additional heat shielding in the vicinity of the susceptor edges, both around and underneath the edges. These shields may be referred to as the inner and outer susceptor edge radiation shields and the bottom inner and outer circumference radiation shields, respectively. Since these shields reduce heat loss from the edges, the coil segments heating the edges may be spaced further away from the susceptor than they would have been otherwise, thus providing a more uniform separation profile.

Another aspect of the present invention provides for a thicker susceptor than is used in conventional reactors. The thicker susceptor allows for temperature variations at the bottom of the susceptor, caused by discrete coil segments, to even out as the heat is conducted through the susceptor to the top surface on which the substrates are supported. Conventional susceptor thicknesses are in a range such as 0.5 to 0.9 inches, and embodiments of the present invention provide for a susceptor thickness in the range 0.5 to 1.5 inches. In one aspect of the present invention, the susceptor thickness was increased from 0.9 to 1.2 inches.

BRIEF DESCRIPTION OF THE DRAWINGS

These and other features and advantages of the present invention will become more apparent to those skilled in the art from the following detailed description in conjunction with the appended drawings in which.

DETAILED DESCRIPTION

The following describes exemplary embodiments of the present invention. Descriptions of specific designs are provided as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1:
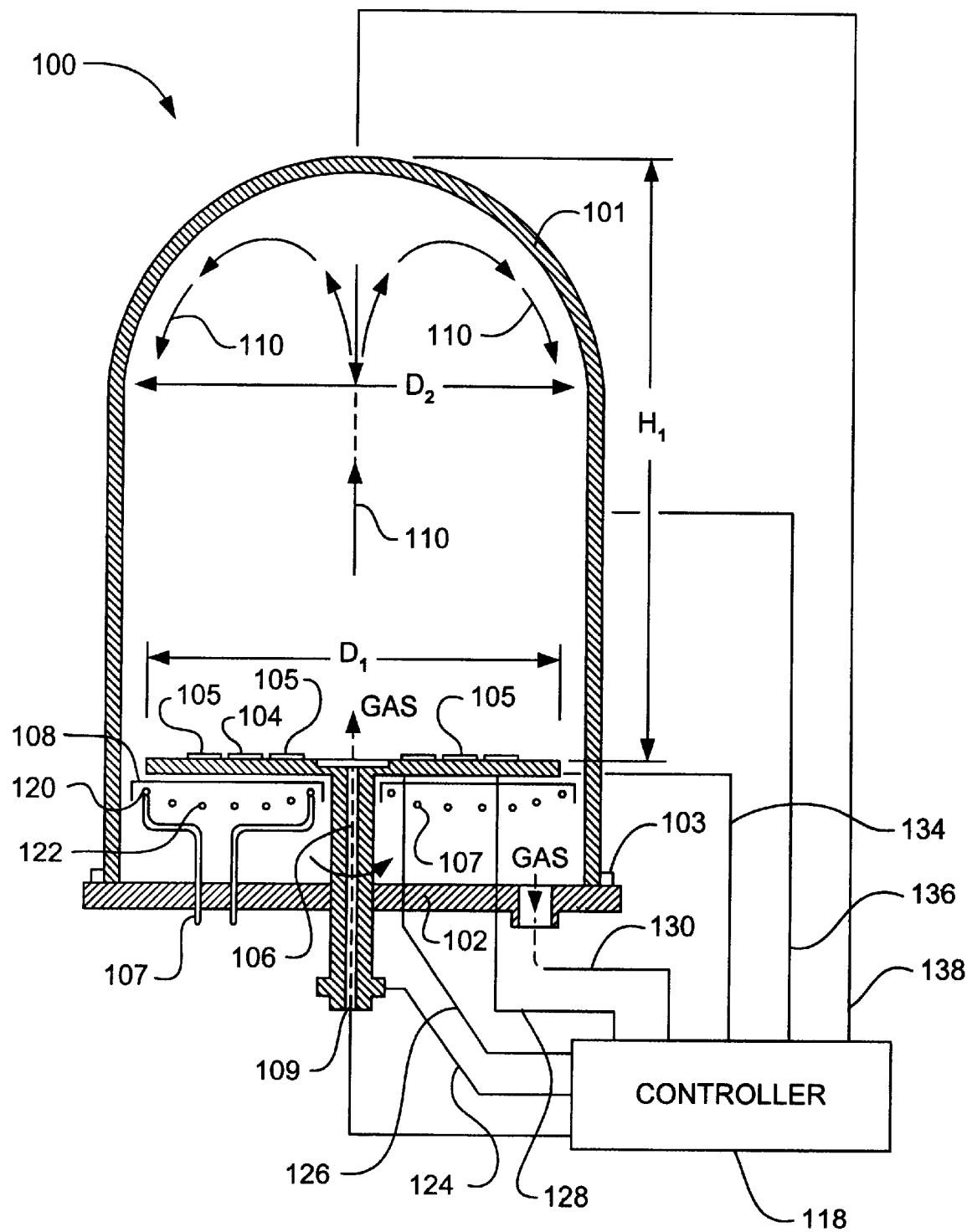
FIG. 1 is a side cross-section of a reactor according to an exemplary embodiment of the present invention.

FIG. 1 is a side cross-section of a CVD reactor, generally indicated at 100, according to an exemplary embodiment of the present invention. The exemplary reactor of FIG. 1 is adapted for epitaxial deposition of silicon with a high degree of uniformity and reduced contamination. Of course, a wide variety of other processes may also be carried out using aspects of the present invention. Referring to FIG. 1, a bell jar enclosure 101 is sealed to a base plate 102 with sealing mechanism 103. A horizontal susceptor 104 supporting substrates 105 rotates about the center axis 106 of the reactor. The susceptor 104 is heated by inductor 107, which may be an induction coil. Induction coil 107 is separated from the susceptor 104 by a coil cover 108, which, with the bell jar enclosure 101, defines the gas reaction volume for the reactor. A cooling medium may be pumped through the coil to prevent the coil from overheating. Gases are introduced through an inlet tube 109 located along the center axis 106 of the reactor. The gas mixture may comprise reactive gases, deposition gases, carrier gases, inert gases, dopant gases, and other types of gases. Of course, in other embodiments, gases may be introduced through tubes or showerheads which pass through the top or sides of the bell jar. Gases entering the enclosure from the bottom follow a pathway roughly indicated by arrows 110, which signify convection currents. Exemplary dimensions $H_1$, $D_1$, and $D_2$ in FIG. 1 are about 38, 32, and 33 inches, respectively.

The exemplary reactor in FIG. 1 is controlled by controller 118. Controller 118 has connections to the bottom of the reactor to regulate gas flow 109. Connection 124 may be used to drive the elevational lift mechanism and provide rotation to the susceptor. Connections 126 and 128 may be used to read information from temperature sensing devices, such as optical pyrometers, from the center and outer edge of the susceptor, respectively. Alternatively, temperature sensing may be done through connections 134, 136, and/or 138; these connections may also be used to inject gases and adjust gas flow. The gas exhaust may be regulated through connection 128 to maintain, among other things, the desired pressure in the reactor. The controller may also be used to regulate the flow of the cooling medium through the coil.

It is known in the art to configure different segments of the induction coil at different distances of separation from the susceptor to compensate for the greater amount of heat loss that occurs at the edges of the susceptor. It should be noted that any given coil configuration is typically configured for the steady-state, high temperature portion of a process, and this configuration is not necessarily optimal for the transient portions of a process such as the heat ramp-up or cool-down. In some embodiments the height of the individual coil segments in a reactor may be automatically adjusted during processing using support studs to be discussed shortly, but in an exemplary embodiment a simpler approach involves moving the susceptor instead. Of course, the mounting plate supporting the studs could be moved up and down as well. These embodiments of the present invention have in common the ability to affect the distance of separation between the inductor and the susceptor receiving energy therefrom. Thus the present invention provides an apparatus and method for optimizing temperature uniformities in both the transient and steady-state portions of a process.

Figure 2:
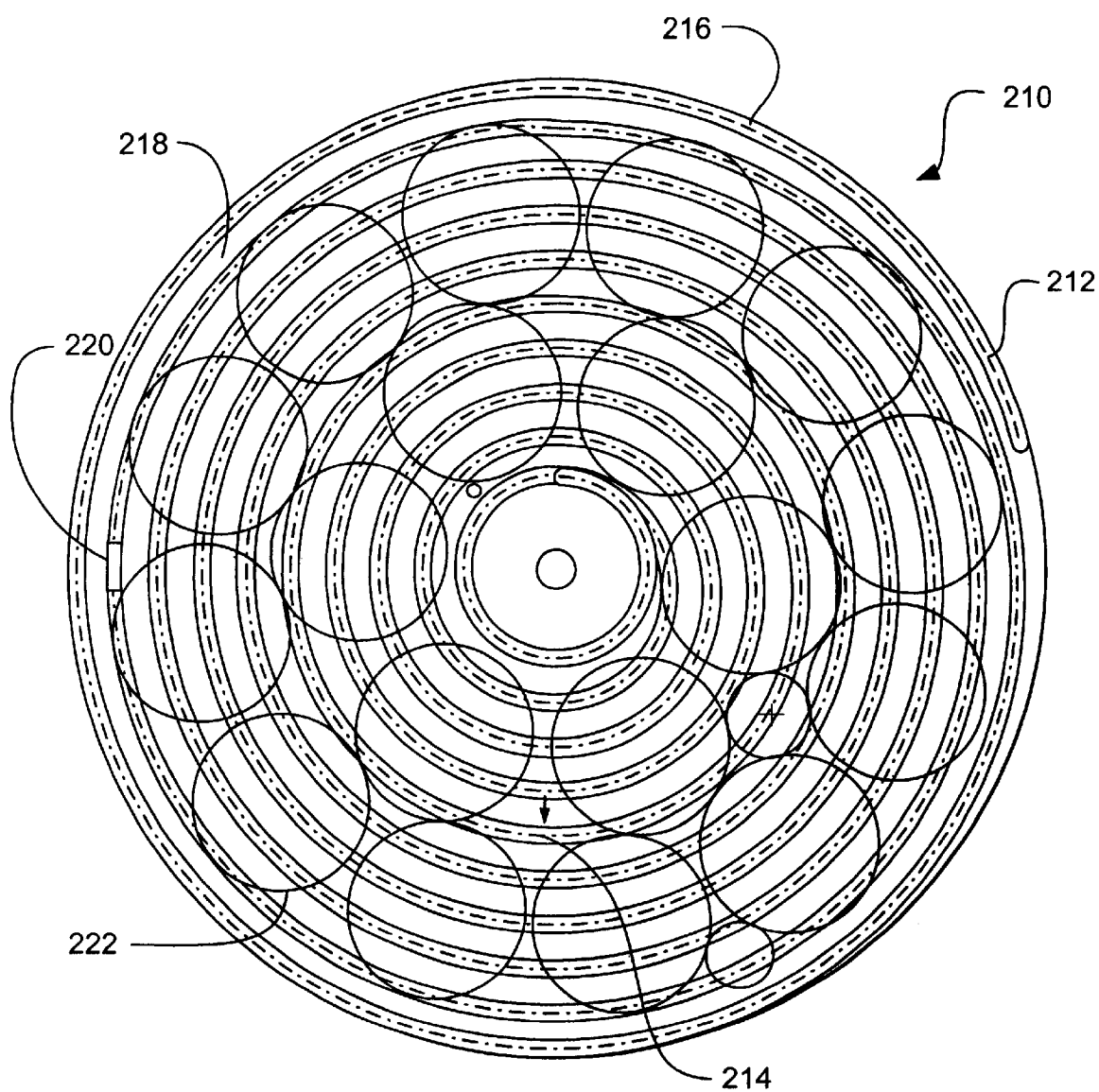
FIG. 2 is a plan view of an inductor coil positioned beneath a susceptor according to one aspect of the present invention.

FIG. 2 is a plan view of a susceptor with a coil beneath the susceptor. For ease of illustration the coil below the susceptor and the position of the wafers on top of the susceptor are shown simultaneously in FIG. 2, although it will be readily understood that the susceptor physically separates the coil from the wafers, and that the susceptor is not actually transparent. It should be noted that the coil could be above, or even within the susceptor. The exemplary susceptor in this figure is designed to simultaneously process eighteen 150 mm substrates. The coil makes about 10 turns in going from its innermost turn 210 to its outermost turn 212. The width of the coil denoted by numeral 214 and the 110 turns of the coil are such that the coil makes about four passes under each of the 150 mm substrates.

The coil is supported by about 50 adjustable studs located at periodic intervals along the coil's length. Several of these stud supports on the outermost turn of the coil are denoted by locations 216, 218, 220, and 222 in FIG. 2. The supports may be adjusted to vary the distance of separation between the segment of the coil held up by that particular stud and the susceptor. The multiple number of adjustable coil supports means that distinct segments of the coil may be maintained by different heights, and therefore coil configurations such is that shown in FIG. 1 are possible.

Figure 3:
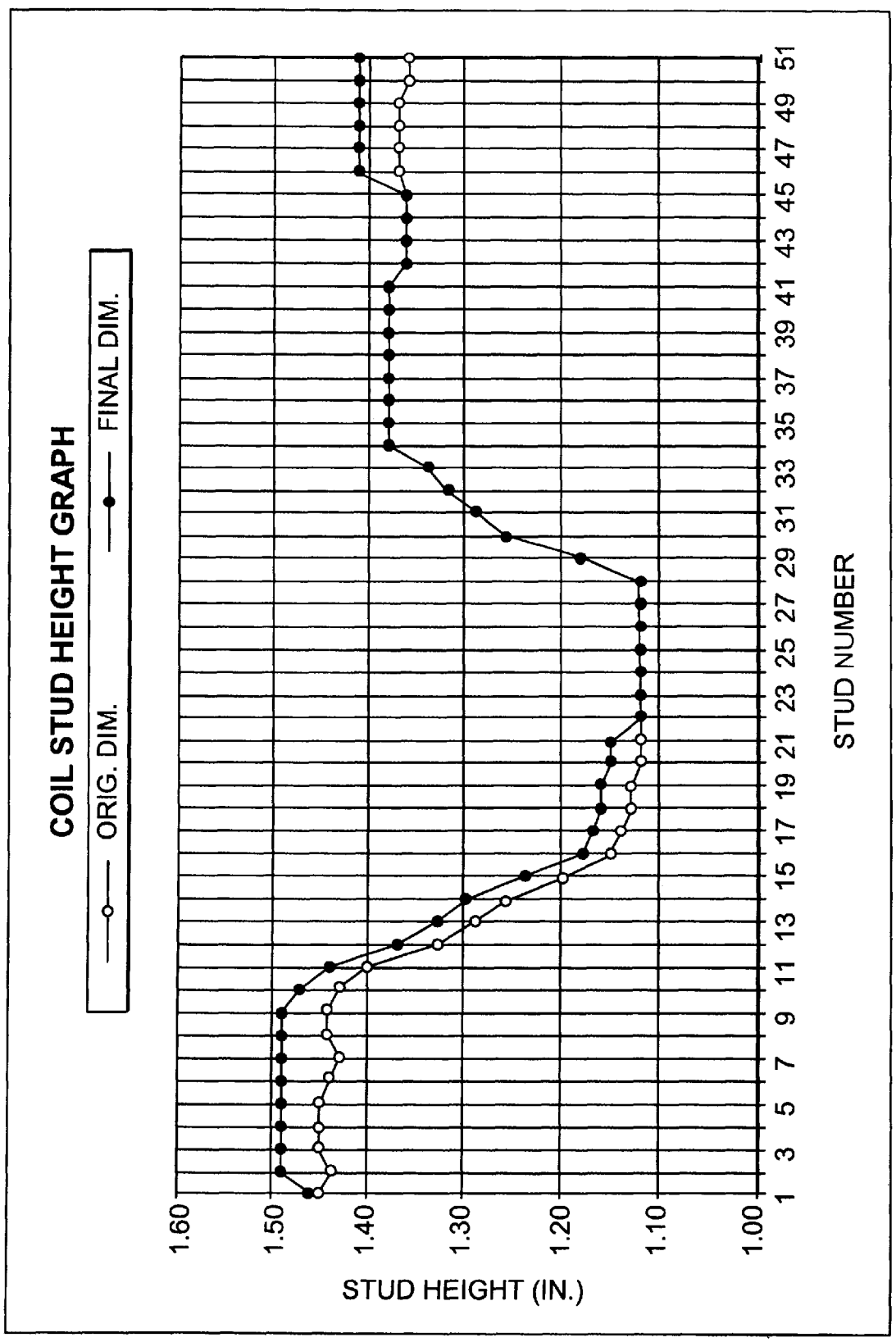
FIG. 3 is a graph of coil stud or support height as a function of position along the exemplary induction coil of FIG. 2.
Figure 4A:
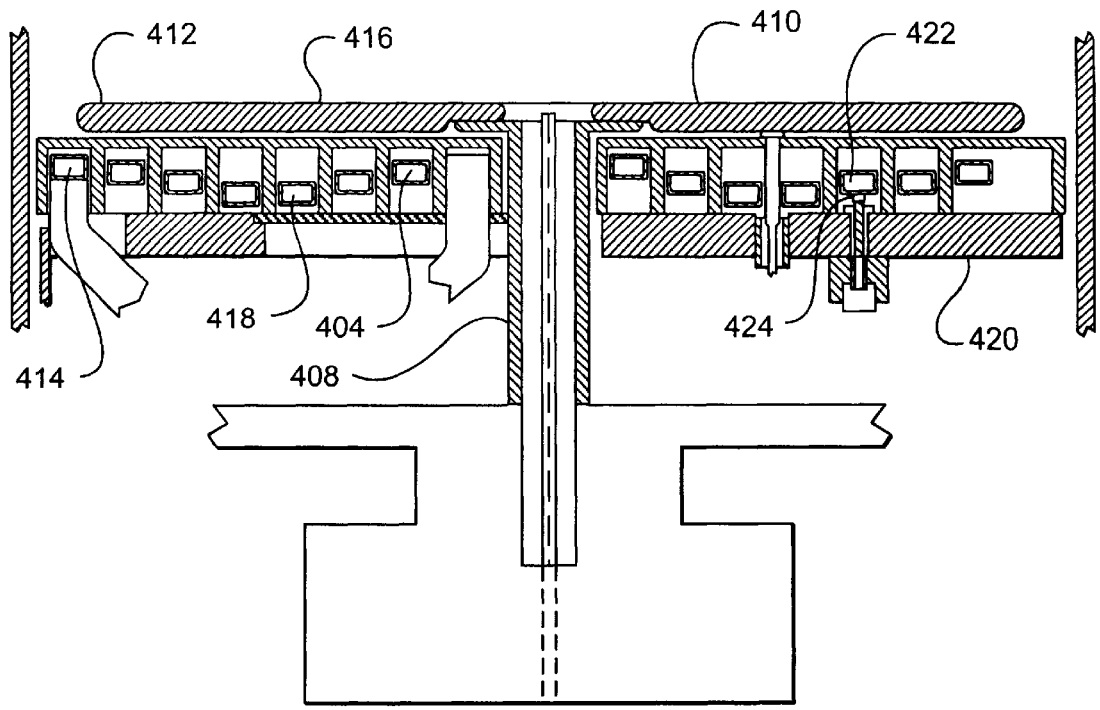
FIG. 4A is a cross-sectional drawing showing the distance of separation between an inductor and a susceptor, where the separation profile is appropriate for steady-state, high temperature portions of a process.

An exemplary coil support height or "stud height" configuration is shown in FIG. 3. Stud height refers to the distance between, for example, coil segment 422 and mounting plate 420 in FIG. 4A, with the actual support depicted in FIG. 4A as stud 424. The heights of the outermost supports (stud numbers 1–10 in FIG. 3) are set to a stud height of about 1.5 inches. Those studs supporting coil segments adjacent to the middle of the susceptor (stud numbers 15–30) are adjusted to about 1.1 to 1.2 inches. These heights are in reference to a mounting plate 420 in FIG. 4A, and thus coil segments supported by studs 1 to 10 will be closer to the susceptor. The heights supporting the innermost studs 35–50 are raised to values higher than those of 15–30, but not quite as high as 1–10 because this region of the susceptor, although an edge, picks up some heat from coil segments on the other side of support stem 408 in FIG. 4A. Referring to FIG. 4A, this means that coil segment 404 is closer to the susceptor than segment 418, but not as close is 414. The coils are adjusted to obtain a temperature profile within a ±5° C. spread across the susceptor at deposition temperatures as measured by an optical pyrometer looking through the bell jar window. The final coil profile is obtained by measuring the epitaxial film resistivity uniformity and adjusting the coil profile to obtain a resistivity uniformity across the entire substrate area within typically a variation of ±2% or less. The dopant gases are very sensitive to changes in substrate temperature and thus provide an excellent means of fine tuning the coil for optimum temperature uniformity.

Figure 4B:
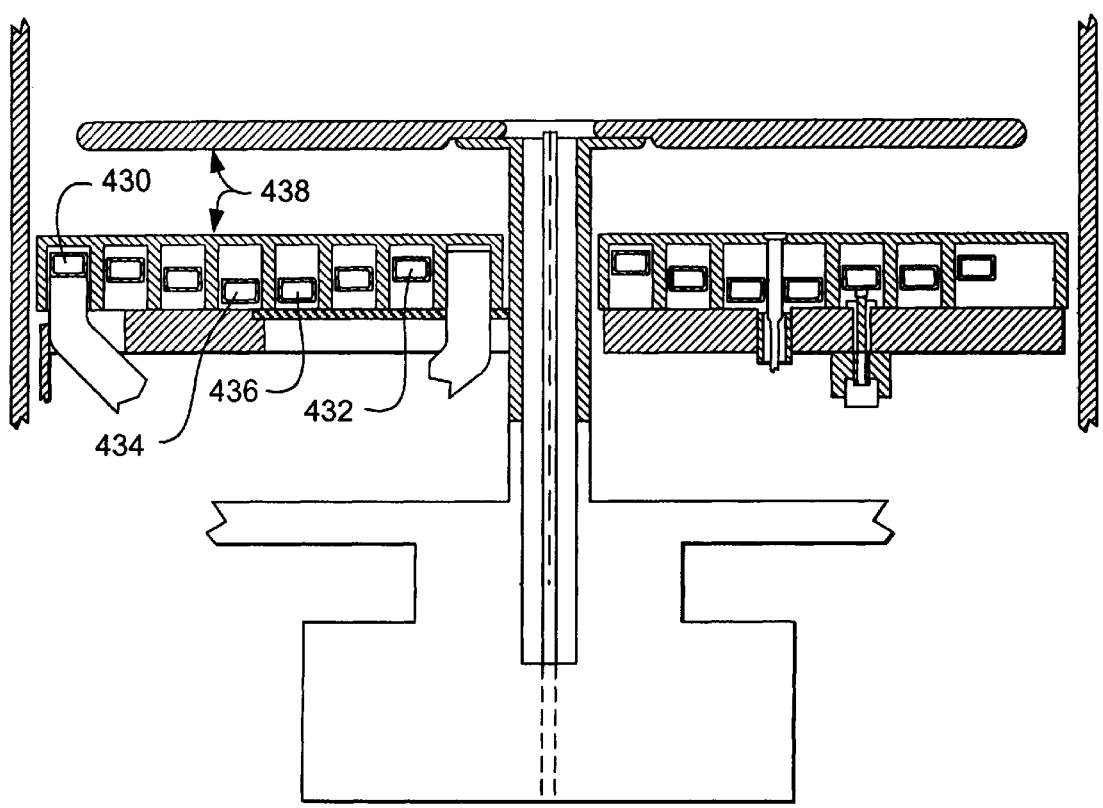
FIG. 4B is a cross-sectional drawing showing the distance of separation between an inductor and a susceptor, where the separation profile is appropriate for the transient, heat ramp-up and cool-down portions of a process.

FIGS. 4A and 4B illustrate one aspect of the present invention, in which temperature uniformity is improved during transient portions of a process by changing the distance of separation between the inductor and the susceptor of an epitaxial CVD reactor. In FIG. 4A, a susceptor 410 is shown in a position closely spaced to an inductor, in this case an induction coil, as it might be during the high-temperature, steady-state portion of an epitaxial process. In this position, the distance of separation between edge of the susceptor 412 and coil segment 414 is smaller than that of the middle of susceptor 416 and coil segment 418. The position of the susceptor in FIG. 4A is for the steady-state process.

Prior to this situation, however, is the transient heat ramp-up. In this aspect of the invention, the susceptor may be positioned as shown in FIG. 4B. Raising the susceptor for a transient portion of a process de-couples coil segments 430 and 432 located adjacent to the edges of the susceptor more so than coil segments 434 and 436 located near the middle. As the susceptor is moved away from the coil, the power coupled to the susceptor is reduced. The coil segments closest to the susceptor couple the most energy into the susceptor, and the drop-off increases non-linearly with distance. Thus, as the susceptor is moved away, the drop-off in power transfer is largest for the closer (edge) coils.

The result is that the small differences in positions among the different coils have less impact as the susceptor is moved away. When the susceptor is close, the difference in distances among the coil segments vary by a relatively large amount in terms of percentage and the difference in power coupled is significant. At larger distances, the power transfer from the coil segments is more similar.

The fact that edge segments couple energy into the susceptor at a different rate than middle segments do, with changes in inductor/susceptor separation distance, comes about because magnetic flux lines surrounding the coil segments fall off non-linearly with distance. Since edge segments are closer to the susceptor, magnetic flux lines intercepted by the susceptor are denser, and thus moving the susceptor away as a greater effect with regard to the generation of heat within the susceptor. Moving the susceptor relative to an inductor for transient portions of the process, when the inductor is configured for the steady-state portion, improves temperature uniformity.

The temperature of the susceptor may be measured by optical pyrometers or other temperature measuring instruments. Monitoring temperatures of the susceptor is important for determining when to adjust the position of the susceptor. For repetitive, predictable processes, however, it may be possible to adjust the distance for set periods of time, according to certain recipes, rather than measuring the temperature at each step of the transient period.

An exemplary process for the transient portion of an epitaxial process may involve the following: starting with the susceptor at a separation distance 438 shown in FIG. 4B; waiting for the rotating susceptor to reach an equilibrated temperature of 700° C.; gradually reducing the distance in fine increments, such as by only about 0.2 inches, since rapid changes can cause problems with the susceptor's silicon carbide coating and/or the RF generator control system; waiting for the susceptor to reach an equilibrated temperature of 800° C.; reducing the distance again by about 0.2 inches; waiting for the susceptor to reach an equilibrated temperature of 1050° C.; and then reducing the distance by a further 0.2 inches. At this point the rotating susceptor is located at the closely spaced position shown in FIG. 4A.

Figure 5:
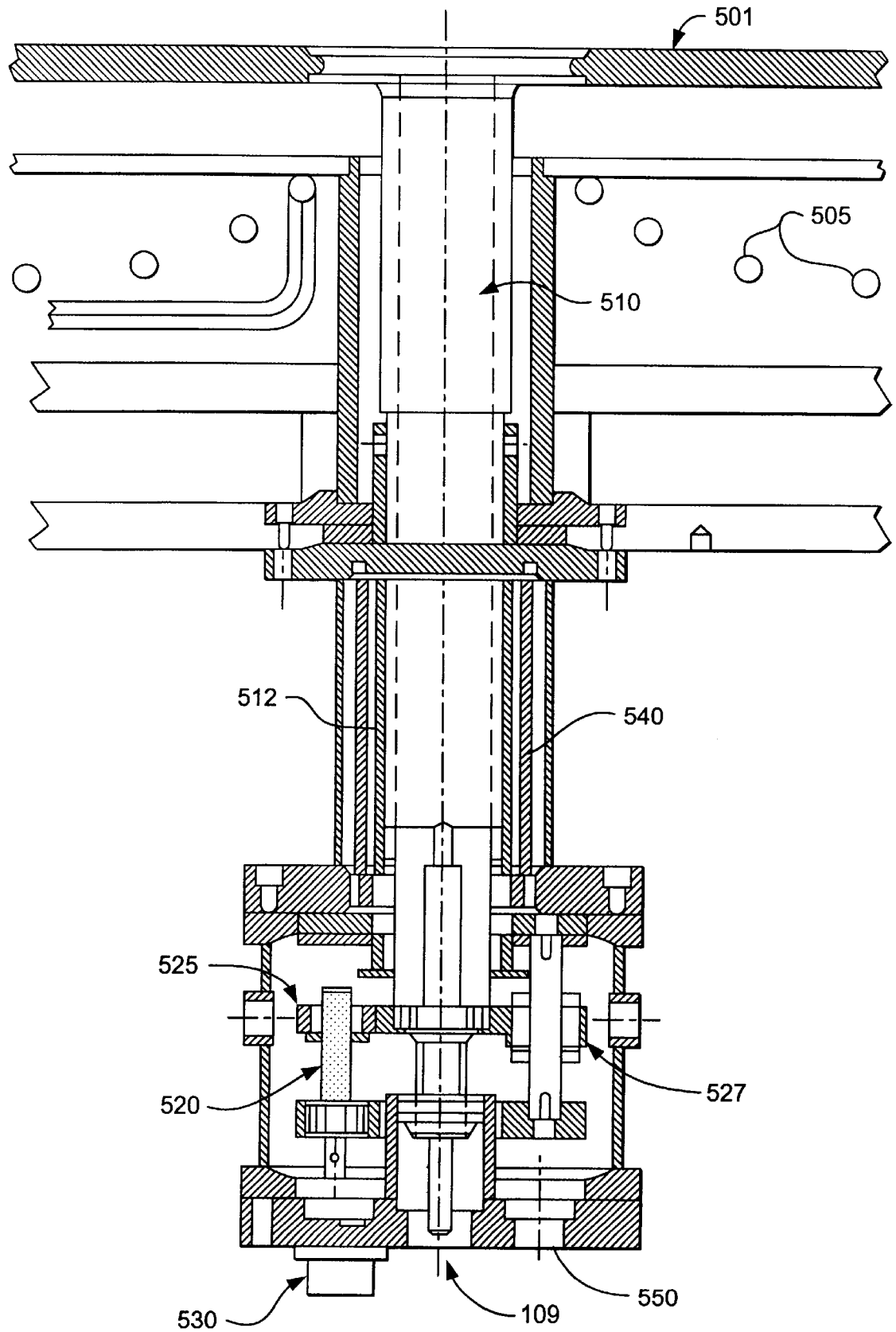
FIG. 5 is a side cross-section of an elevational lift mechanism that may be used in an aspect of the present invention.

A cross-section of the mechanism used to raise and lower the susceptor is shown in FIG. 5, where susceptor 501 is shown in relationship to the RF coil assembly 505. The susceptor 501 is supported by a pedestal 510, which rests in pedestal cup 512 and is raised or lowered by susceptor lift plate 525. The pedestal cup may comprise stainless steel.

Lift plate 525 is driven up and down by lead screw 520. Rotary motion from a motor (not shown) is transmitted to the lead screw through a rotary feedthrough 530. The alignment of the susceptor lift plate is maintained by the use of linear bearing(s) 527. The linear bearings may also be referred to as lift guide bearing(s). A second rotary feedthrough 550 is used to provide rotation to the susceptor (where the drive for the rotation mechanism is not shown) through a gear on rotation sleeve 540.

Figure 6:
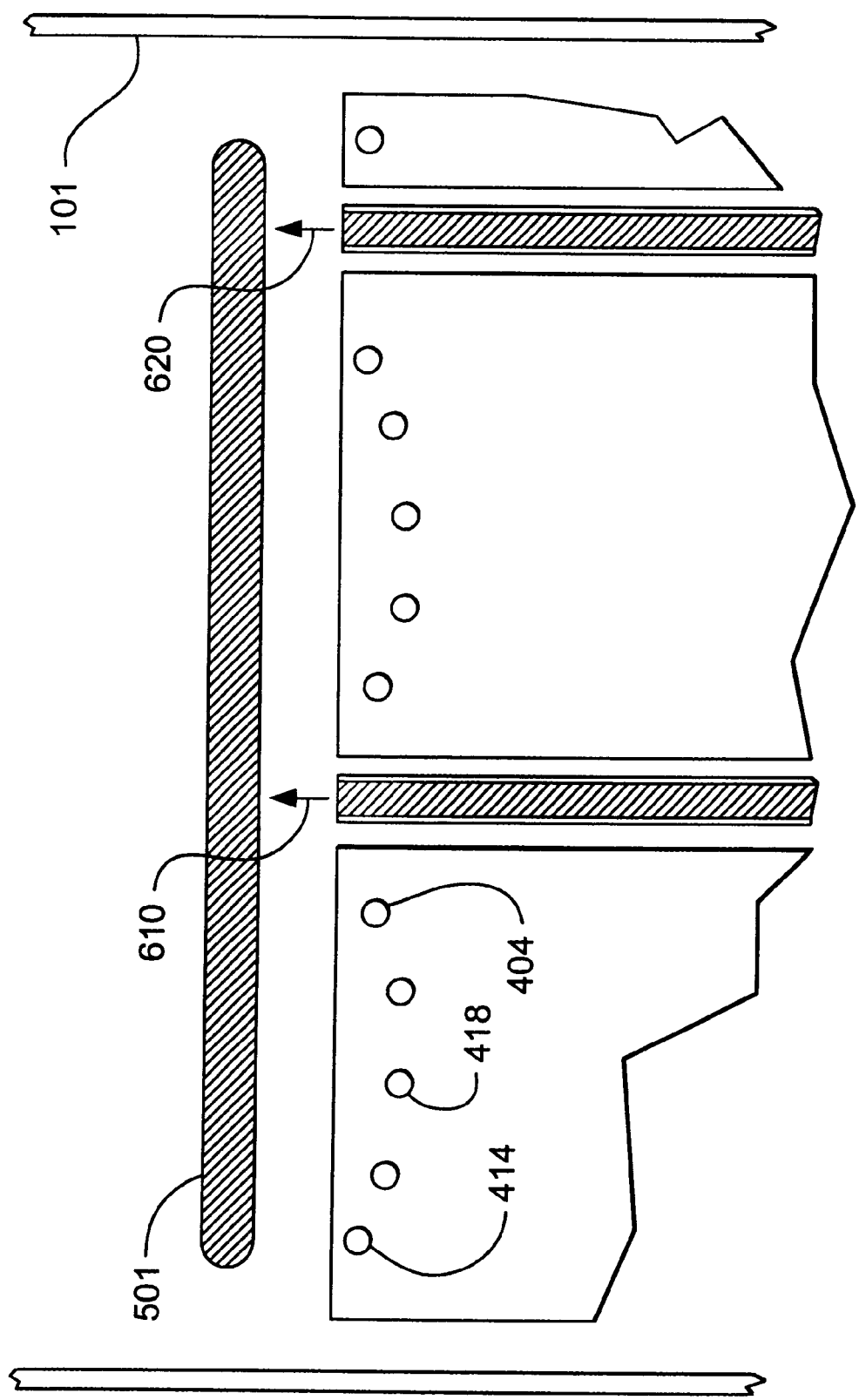
FIG. 6 is a side cross-sectional view illustrating exemplary optical pyrometers that may be used to regulate the distance of separation between the inductor and the susceptor.

FIG. 6 illustrates an aspect of the present invention in which the susceptor lift is controlled by a controller which monitors temperature variations across the susceptor. In an exemplary embodiment, a transient heat ramp would begin with the susceptor in its upper most position. The susceptor is then lowered until the center temperature, as measured by optical pyrometer 610, increases to substantially match the temperature at the susceptor's outer edge, as measured by optical pyrometer 620.

Figure 7:
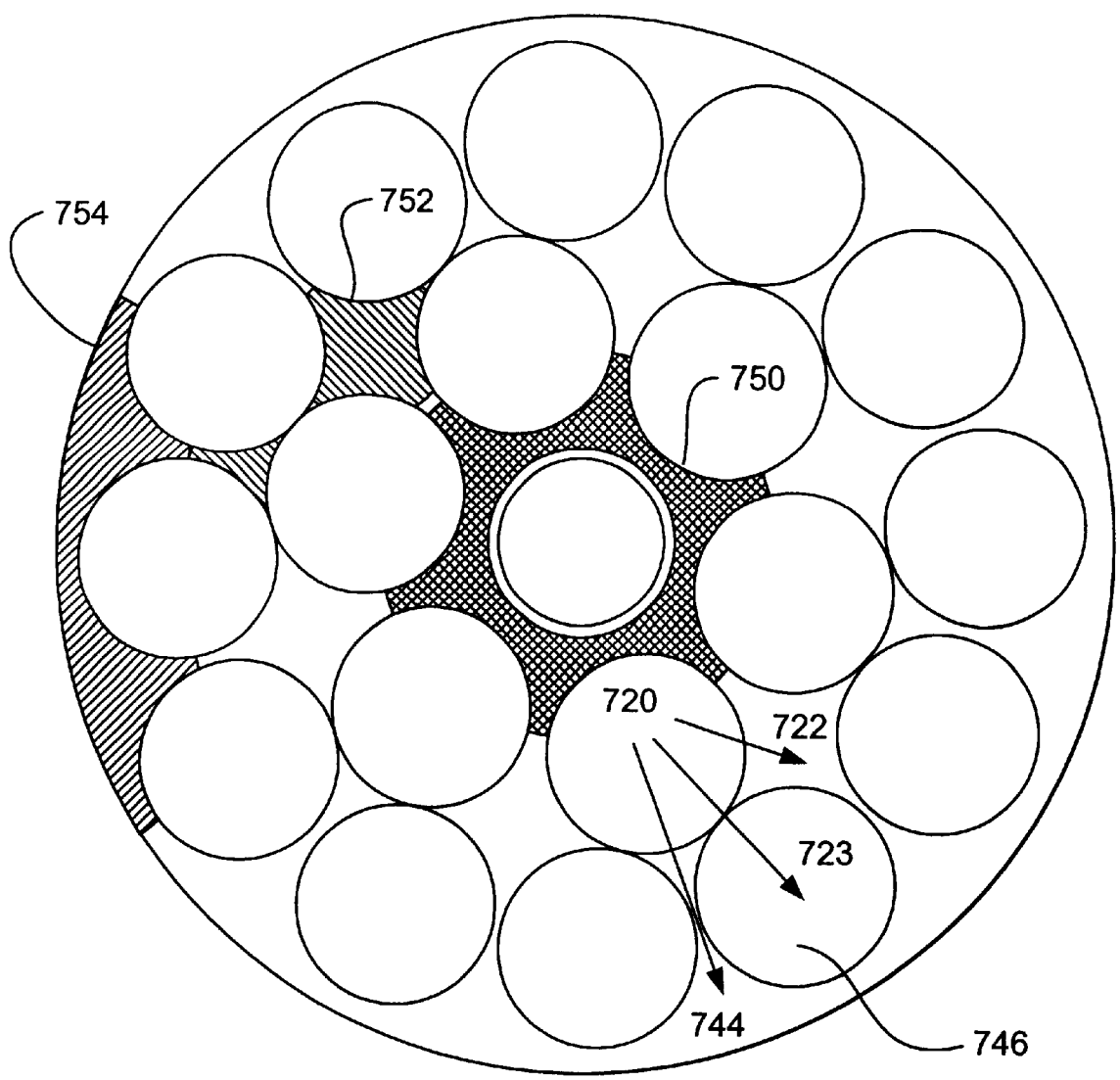
FIG. 7 is a plan view of the arrangement of 150 mm wafers on an exemplary susceptor; the drawing shows the variety of thermal environments a substrate may experience, as well as exemplary heat shielding that may be designed to fit between substrates.

FIG. 7 illustrates embodiments of the present invention that use heat shielding to improve temperature uniformity. The exemplary susceptor of FIG. 7 supports eighteen 150 mm substrates. Of course, substrates could be arranged in a single row, along an annulus around the middle of the susceptor, but this pattern does not allow for the larger number of substrates to be simultaneously processed with the double row pattern of FIG. 7, which achieves a higher throughput. In FIG. 7, there are two substrates within the outer annulus for every one substrate in the inner annulus. This embodiment may of course be used alone, in combination with the movable susceptor, or with other aspects of the present invention.

Although this technique increases the throughput of the reactor, it may lead to a new temperature non-uniformity in that the substrate will see a greater variety of thermal environments in directions parallel to the plane of the susceptor. For example, substrate 746 provides some insulation for substrate 720 along direction 723; at least more insulation than the lack of a substrate provides along directions 722 and 744. It should be noted that even along directions 722 and 744, both of which lead to pockets between substrates, the thermal environment is not the same. The pocket in the 744 direction is smaller, and thus provides greater insulation for substrate 720 than the larger pocket along direction 722. Exemplary embodiments of the present invention provide increased thermal uniformity in directions parallel to the top susceptor surface using thermal shields. The thermal shields may have a variety of shapes, owing in part to the fact that they may rest in the areas between the substrate pockets on the top surface of the susceptor. Alternatively, the thermal shields can also be registered to fit into matching pockets on the susceptor. The variation in the shape of the shields will be dependent on substrate diameter and the number of pockets in the susceptor.

Figure 8A:
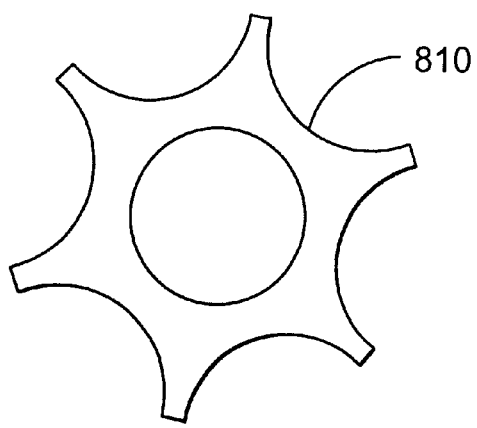
FIGS. 8A, 8B, and 8C are exemplary heat shields which may be placed on the susceptor to improve the heat uniformity of the susceptor.
Figure 8B:
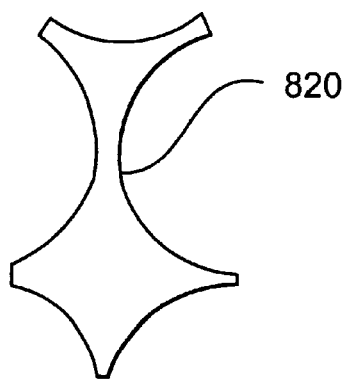
Figure 8C:
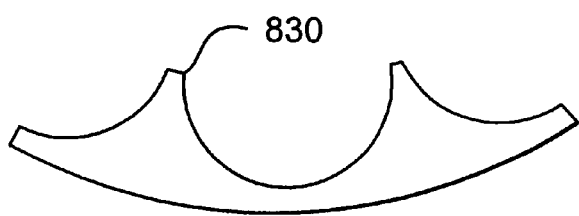

The purpose of the shields is to provide for each substrate a situation such that each edge of the substrate is exposed to substantially the same thermal environment; that the thermal environment is substantially the same for all the substrates being processed; and that the thermal environment is independent of position on the susceptor. A representative selection of shields is shown in FIG. 7 as shields 750, 752, and 754, and are reproduced in FIGS. 8A, 8B, and 8C as shields 810, 820, and 830, respectively. The shields may be silicon carbide or silicon carbide coated graphite, and may range from about 0.02 to 0.06 inches in thickness. A general rule of thumb is that the shield thickness should be substantially the same as the thickness of the substrate.

Figure 9A:
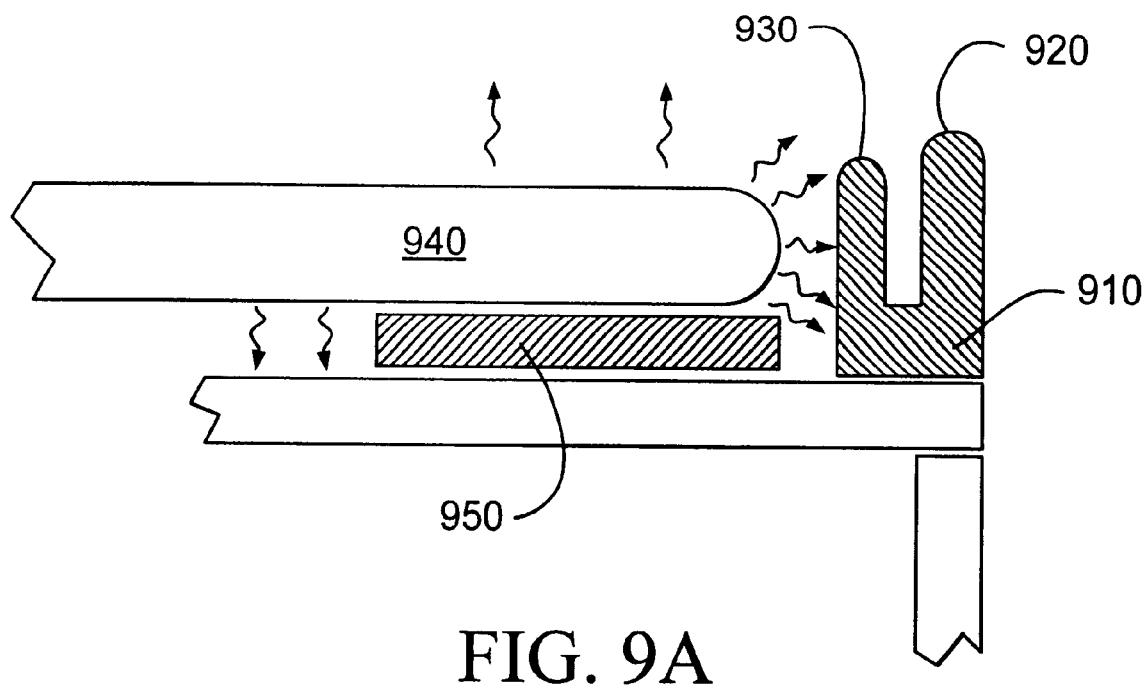
FIG. 9A illustrates two exemplary heat shields that may be used at the edge of the susceptor in exemplary embodiments of the present invention.

Temperature uniformity in lateral directions, parallel to the top surface of the susceptor, may also be influenced by shields positioned at the edges of the susceptor, such as shield 910 shown in FIG. 9A. There may be multiple shields at the edge of the susceptor, or shield 910 may be split into two vertical portions 920 and 930 to thermally insulate the inner as well as outer edges of susceptor 940, providing an increased degree of insulation than otherwise would have been provided with a single shield having an equivalent thickness of 920 and 930 combined. The shield materials may comprise silicon carbide, or silicon carbide coated graphite.

Figure 9B:
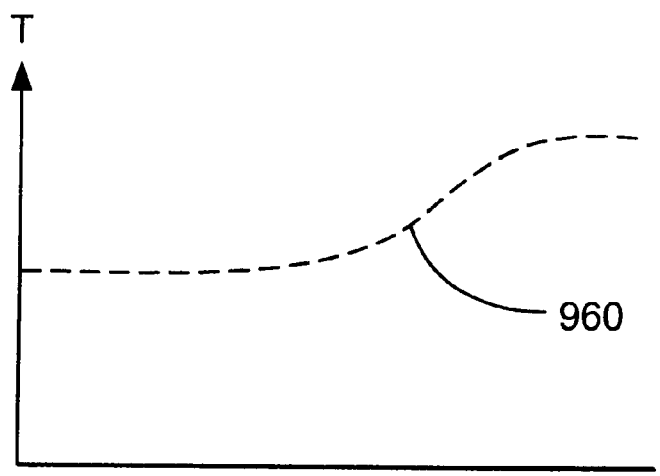
FIG. 9B is a graph of thermal profile of the susceptor in a radial direction, showing the benefit achieved with the use of the exemplary heat shields of FIG. 9A.

Temperature uniformity of the susceptor in vertical directions, parallel to the axis of the susceptor, may be improved as well according to further aspects of the present invention. This may be done with the use of susceptor edge radiation shields (bottom radial circumference), shown as reference numeral 950 in FIG. 9A. The result of adding these shields on the temperature profile in a radial direction (parallel to the top surface of the susceptor) is shown as curve 960 in FIG. 9B.

Figure 10A:
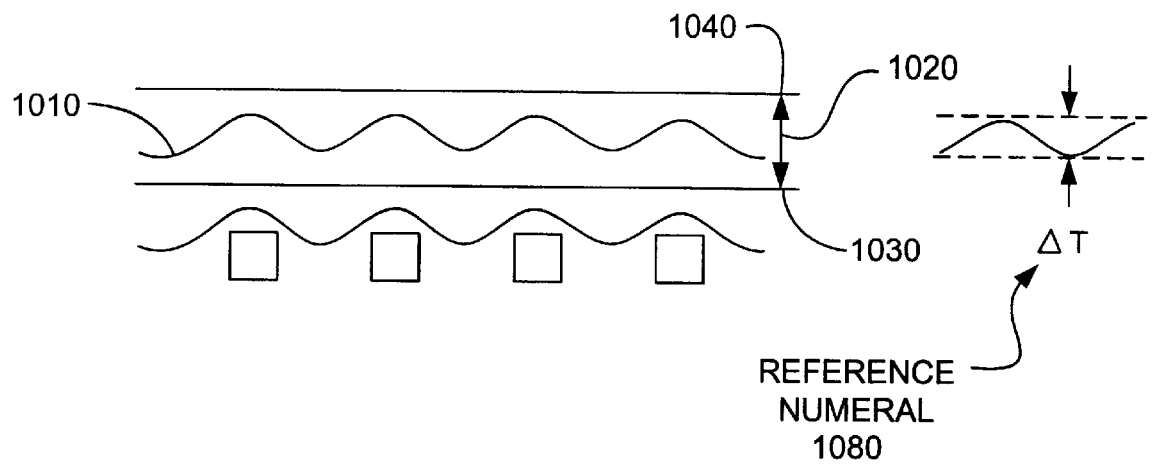
FIG. 10A is a schematic drawing depicting temperature uniformity in the axial direction of a thin susceptor.
Figure 10B:
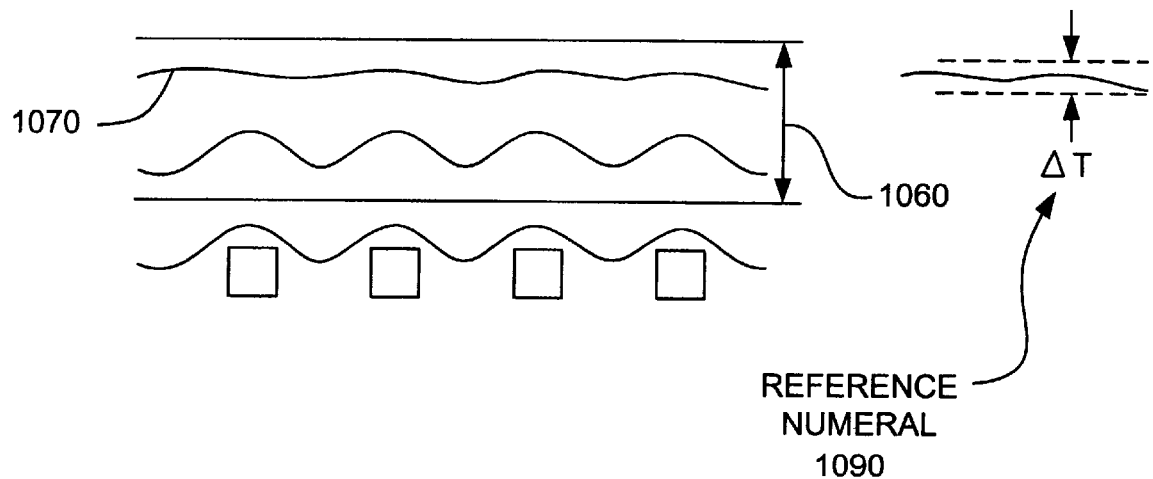
FIG. 10B is a schematic drawing depicting temperature uniformity in the axial direction of a thick susceptor.

Additionally, temperature uniformity in the axial direction (normal to the susceptor) may be improved by increasing the thickness of the susceptor, as shown in FIGS. 10A and 10B. Temperature non-uniformities in the axial direction are shown as curves 1010 in FIG. 10A; these non-uniformities are due to the discrete nature of the inductor coil segments and the sections of the susceptor they heat. By the time the heat has been transferred through the susceptor thickness 1020 from lower surface 1030 to upper surface 1040, the temperature uniformity may have been somewhat evened out. By increasing the susceptor thickness from 1020 in FIG. 10A (which may be about 0.9 inches) to that depicted by numeral 1060 in FIG. 10B (which may be about 1.2 inches) the susceptor temperature uniformity smooths out further to curve 1070 shown in FIG. 10B.

This reduces temperature non-uniformities in directions parallel to the susceptor top surface from profile 1080 in figure 10A to profile 1090 in FIG. 10B. Conventional susceptor thicknesses are in the range 0.5 to 0.9 inches, and embodiments of the present invention provide for a susceptor thickness in the range 0.5 to 1.5 inches. In one aspect of the present invention, the susceptor thickness was increased from 0.9 to 1.2 inches.

The design of the thickness of the susceptor is also influenced by the frequency at which the RF generator is operated: as frequency of operation is decreased, the penetration depth of energy into the susceptor is increased, and thus, the thickness of the susceptor must be increased. Furthermore, the design is motivated by the fact that it is more cost effective to operate the RF generator at low frequencies, where low frequencies refer to 25 to 30 KHz, as opposed to older systems operating at 180 and even 350 to 450 KHz. The mechanical stability of the system is improved as well, since the susceptor may only be supported at its central regions.

Of course, the various embodiments of the present invention may be used alone and in combination. In other words, in some situations it may be appropriate to use a thicker susceptor in conjunction with the batwing thermal shields. In other situations, varying the separation distance between the inductor and the susceptor, along with shielding around the susceptor's outer edge, using a thinner susceptor, might provide the best thermal uniformity. It will be appreciated by those skilled in the art that use of some aspects of the present invention, such as susceptor edge shielding, may alleviate the degree to which other aspects of the invention are practiced, such as a relative movement of the susceptor in an axial direction relative to the inductor.

While this invention has been described and illustrated with reference to particular embodiments, it will be readily apparent to those skilled in the art that the scope of the present invention is not limited to the disclosed embodiments but, on the contrary, is intended to cover numerous other modifications and equivalent arrangements which are included within the spirit and scope of the following claims.

What is claimed is:

1. A method of processing a semiconductor substrate, the method comprising the steps of:

positioning the substrate adjacent to a susceptor;

inductively coupling energy from an inductor to the susceptor to heat the susceptor;

injecting a gas into the chamber;

varying the distance of separation between the inductor and the susceptor;

thermally shielding the edges of the susceptor using an inner and an outer shield; and depositing a layer of material on the substrate.

2. The method of claim 1, wherein the inductor is an induction coil.

3. The method of claim 1, further comprising the step of rotating the susceptor.

4. The method of claim 1, wherein the susceptor is silicon carbide coated graphite.

5. The method of claim 1, further comprising the step of varying the distance of separation between the inductor and the susceptor after processing ends.

6. The method of claim 1, wherein the step that varies the distance of separation between the inductor and the susceptor is accomplished by moving the susceptor.

7. The method of claim 1, wherein the step that varies the distance of separation between the inductor and the susceptor is accomplished by adjusting the height of coil studs.

8. The method of claim 1, wherein the step that varies the distance of separation between the inductor and the susceptor is accomplished by moving a mounting plate to which the inductor is attached.

9. The method of claim 1, further comprising the step of adjusting the distance of separation between the inductor and the susceptor during processing.

10. The method of claim 1, further comprising the step of thermally shielding the top surface of the susceptor in the regions where substrates are absent.

11. The method of claim 10, wherein the step of thermally shielding the top surface of the susceptor comprises using a shield resting in spaces between substrate pockets.

12. The method of claim 10, wherein the step of thermally shielding the top surface of the susceptor comprises using a shield registered to fit into matching pockets on the susceptor.

13. The method of claim 1, wherein the susceptor has a thickness of between 0.9 and 1.5 inches.

14. A method of processing a semiconductor substrate, the method comprising the steps of:

positioning the substrate adjacent to a susceptor;

inductively coupling energy from an inductor to the susceptor to heat the susceptor;

injecting a gas into the chamber;

varying the distance of separation between the inductor and the susceptor;

thermally shielding the top surface of the susceptor in the regions where substrates are absent using a shield resting in spaces between substrate pockets; and depositing a layer of material on the substrate.

15. The method of claim 14, wherein the inductor is an induction coil.

16. The method of claim 14, further comprising the step of rotating the susceptor.

17. The method of claim 14, further comprising the step of thermally shielding the edges of the susceptor.

18. The method of claim 17, wherein the step of thermally shielding the edges of the susceptor comprises using an inner and an outer shield.

19. The method of claim 17, wherein the step of thermally shielding the edges of the susceptor comprises using a shield that is split into inner and outer vertical portions.

20. The method of claim 17, wherein the step of thermally shielding the edges of the susceptor comprises using a bottom radial shield.

21. The method of claim 14, wherein the susceptor is silicon carbide coated graphite.

22. The method of claim 14, further comprising the step of varying the distance of separation between the inductor and the susceptor after processing ends.

23. The method of claim 14, wherein the step that varies the distance of separation between the inductor and the susceptor is accomplished by moving the susceptor.

24. The method of claim 14, wherein the step that varies the distance of separation between the inductor and the susceptor is accomplished by adjusting the height of coil studs.

25. The method of claim 14, wherein the step that varies the distance of separation between the inductor and the susceptor is accomplished by moving a mounting plate to which the inductor is attached.

26. The method of claim 14, further comprising the step of adjusting the distance of separation between the inductor and the susceptor during processing.

27. The method of claim 14, wherein the susceptor has a thickness of between 0.9 and 1.5 inches.

28. A method of processing a semiconductor substrate, the method comprising the steps of:

positioning the substrate adjacent to a susceptor;

inductively coupling energy from an inductor to the susceptor to heat the susceptor;

injecting a gas into the chamber;

varying the distance of separation between the inductor and the susceptor;

thermally shielding the edges of the susceptor using a shield that is split into inner and outer vertical portions; and depositing a layer of material on the substrate.

29. A method of processing a semiconductor substrate, the method comprising the steps of:

positioning the substrate adjacent to a susceptor;

inductively coupling energy from an inductor to the susceptor to heat the susceptor;

injecting a gas into the chamber;

varying the distance of separation between the inductor and the susceptor;

thermally shielding the edges of the susceptor using a bottom radial shield; and depositing a layer of material on the substrate.

30. A method of processing a semiconductor substrate, the method comprising the steps of:

positioning the substrate adjacent to a susceptor;

inductively coupling energy from an inductor to the susceptor to heat the susceptor;

injecting a gas into the chamber;

varying the distance of separation between the inductor and the susceptor;

thermally shielding the top surface of the susceptor in the regions where substrates are absent using a shield registered to fit into matching pockets on the susceptor; and depositing a layer of material on the substrate.

* * * * *